United States Patent
Liu et al.

(10) Patent No.: US 9,331,014 B1
(45) Date of Patent: *May 3, 2016

(54) TUNABLE POWER DISTRIBUTION NETWORK AND METHOD OF USE THEREOF

(71) Applicant: Altera Corporation, San Jose, CA (US)

(72) Inventors: Hui Liu, San Jose, CA (US); Hong Shi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 82 days.

This patent is subject to a terminal disclaimer.

(21) Appl. No.: 14/231,434

(22) Filed: Mar. 31, 2014

Related U.S. Application Data

(63) Continuation of application No. 13/158,053, filed on Jun. 10, 2011, now Pat. No. 8,716,898.

(51) Int. Cl.
*H01L 23/522* (2006.01)
*H01L 49/02* (2006.01)
*H02J 1/00* (2006.01)

(52) U.S. Cl.
CPC ........... *H01L 23/5223* (2013.01); *H01L 28/40* (2013.01)

(58) Field of Classification Search
USPC .................................................. 307/102, 147
See application file for complete search history.

(56) References Cited

U.S. PATENT DOCUMENTS 8,716,898 B1 * 5/2014 Liu ..................... H01L 23/00
307/102

* cited by examiner

*Primary Examiner* — Robert Deberadinis
(74) *Attorney, Agent, or Firm* — Kelley Drye & Warren LLP

(57) ABSTRACT

An improved power distribution network comprises a substrate, an integrated circuit mounted on the substrate, first and second tunable decoupling capacitors mounted on the substrate, and a third decoupling capacitor formed in the integrated circuit. The power supply pin is connected to the first, second, and third capacitors; and the first and second capacitors are connected to the third capacitor as well. The capacitance values of the first and second tunable decoupling capacitors may be adjusted to reduce the magnitude of the system level impedance at least at those frequencies having substantial signal jitter to power noise sensitivity.

20 Claims, 3 Drawing Sheets

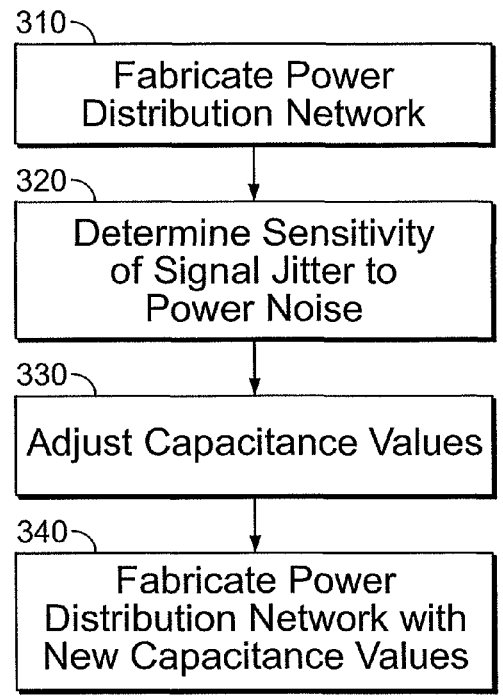
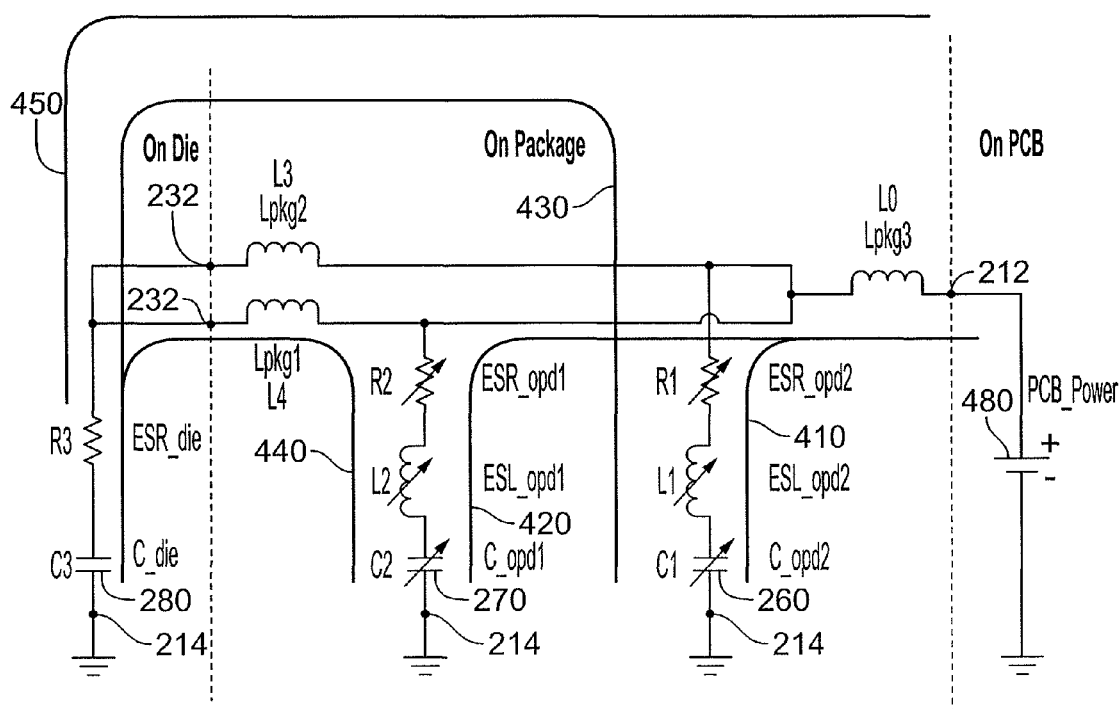

TUNABLE POWER DISTRIBUTION NETWORK AND METHOD OF USE THEREOF

CROSS REFERENCE TO RELATED APPLICATION

This application is a continuation of application Ser. No. 13/158,053, filed Jun. 10, 2011, now U.S. Pat. No. 8,716,898 B1, which application is incorporated by reference herein.

BACKGROUND

This relates to a power distribution network for a high frequency integrated circuit package such as used in a high speed serial interface (HSSI).

A typical integrated circuit package comprises a package substrate, a first array of connectors on an exterior surface of the substrate, a second array of connectors on an interior surface of the substrate substantially parallel to the exterior surface and an integrated circuit mounted on the second array of connectors. The connectors of each array are solder balls or solder bumps and will be referred to collectively hereafter as "pins."

The package substrate is a multi-layer structure comprising a series of electrically conducting metal layers that are insulated from one another by inter-metallic dielectric layers. Each of the layers is substantially parallel to the exterior surface of the package. Interconnection paths are defined in the metal layers; and selective connections are made by vias between the paths in the various layers so as to connect the pins of the first array to the pins of the second array. Further details on package substrates are found in R. R. Tummala (Ed.), *Fundamentals of Microsystems Packaging* (McGraw-Hill 2001), which is incorporated herein by reference.

As is known in the art, a conventional integrated circuit comprises a semiconductor substrate, such as silicon, in which various devices are formed and a series of metal interconnect layers separated by insulating dielectric layers that overlie the semiconductor substrate. Further details concerning integrated circuits are set forth in N. H. E. Weste and D. Harris, *CMOS VLSI Design: A Circuits and Systems Perspective* ($3^{rd}$ Ed., Pearson Addison Wesley, 2005), which is incorporated herein by reference.

When circuits are switched, noise is generated in the power distribution network. One approach to suppressing this noise is to provide decoupling capacitors in the power distribution network, either in the metal layers of the integrated circuit or in discrete capacitors mounted on the package substrate. Further details on such use of decoupling capacitors are found at pages 169-172 of R. R. Tummala, op. cit., which are incorporated by reference herein.

One application of integrated circuits is as high speed serial interfaces such as those that are compliant with the high speed serial interface (HSSI) protocol. The design of power distribution networks for HSSI circuitry is very complicated; and present networks leave much to be desired. One such design provides a single path power distribution network from a power supply pin on the exterior of the package substrate, through the substrate to a load and a decoupling capacitor on the integrated circuit. A second design provides a three path power distribution network, one path from the power supply pin to a decoupling capacitor on the substrate, a second path from the power supply pin to a decoupling capacitor and load on the integrated circuit, and a third path between the decoupling capacitor on the substrate and the decoupling capacitor on the integrated circuit. Neither design is wholly satisfactory. As shown in FIG. 1, which is a plot of system level impedance versus operating frequency for these networks, the impedance of these networks varies considerably over an operating range of approximately 0 to 600 MHz. Moreover, the single path power distribution network shown as plot 110 has a very high impedance peak; and while the three path power distribution network shown as plot 120 lowers the maximum impedance peak, it increases the impedance over that of the one path network in the region B of approximately 200 to 350 MHz.

In addition, neither the single path nor the three path network design takes into consideration the effect of power noise on signal jitter. For extremely high frequency applications, this effect is largely unknown at the time the circuit is designed. However, this effect can be considerable and must be accounted for.

SUMMARY

The present invention is an improved power distribution network and design method for an integrated circuit package intended for use at high frequencies such as those needed to support high speed serial interfaces.

In an embodiment of the invention, a power distribution network includes a plurality of on package capacitors and at least one on die capacitor. Electrical interconnection paths extend through a package substrate to each of the on package capacitors; and additional electrical interconnection paths extend through the substrate from each of the on package capacitors to the on die capacitor.

The circuit is designed so that the on package capacitors are tunable and have different capacitances and therefore different parasitic resistances and inductances. Illustratively, each capacitor is designed to have a capacitance that is at least 50 percent (%) greater than that of the next smaller capacitor. After the circuit is made, the capacitance and parasitic resistance and inductance values of the on package capacitors are optimized based on a signal jitter to power noise sensitivity map. The optimized capacitance, resistance and inductance values are then used for the fabrication of production devices.

BRIEF DESCRIPTION OF THE DRAWINGS

These and other objects and advantages of the present invention will be apparent to those of ordinary skill in the art in view of the following detailed description in which:

FIG. 3 is a flow chart depicting an illustrative method of the invention;

FIG. 4 is a circuit diagram for the embodiment of FIG. 2; and

In the drawings, like elements have been identified by like numbers.

DETAILED DESCRIPTION

Figure 2:
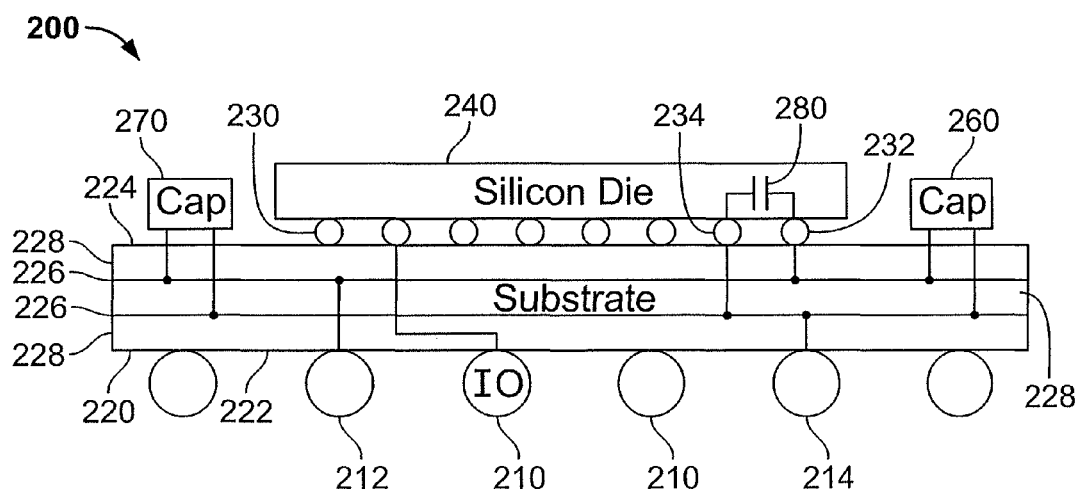
FIG. 2 is a side view of an illustrative embodiment of the invention.

In accordance with one embodiment of the invention, the design of a power distribution network includes a plurality of on package capacitors having different capacitances that are tunable. FIG. 2 is a side view of an illustrative embodiment of an integrated circuit package 200 of the invention. Package 200 comprises a package substrate 220, an integrated circuit, or die, 240, a first on package decoupling capacitor 260, a second on package decoupling capacitor 270, and an on die decoupling capacitor 280. Connectors, or pins, 210 are located on an exterior surface 222 of substrate 220 to connect to the next level of packaging such as a printed circuit board; and connectors, or pins, 230 are located on an interior surface 224 of substrate 220 to provide electrical and mechanical connection to integrated circuit 240.

Within substrate 220 are a series of electrically conducting metal layers 226 that are insulated from one another by dielectric layers 228 that constitute most of the remainder of the substrate. Illustratively, the metal layers are copper; and the dielectric layers are an epoxy-resin such as FR-4.

Integrated circuit 240 may include an on die capacitor 280. On die capacitors are typically formed using two of the upper metal layers and an intervening insulating dielectric layer. Alternatively, on die capacitors can be formed as trench capacitors. On package capacitors 260, 270 illustratively are discrete decoupling capacitors.

Interconnection paths are defined by processes in the metal layers 226 of substrate 220 and selective connections are made by vias between the paths in the various layers so as to connect pins 210 to pins 230 and to on package capacitors 260, 270. In the interests of clarity, several of the metal layers and many of the connections between pins 210 and pins 230 are not depicted in FIG. 2; but it will be understood by those skilled in the art that most, if not all, of pins 210 and pins 230 are connected to paths through the metal layers.

Of particular interest are the paths that extend from power and ground pins 212, 214 through metal layers 226 to couple a power supply and ground to on package capacitors 260, 270; the paths that extend from the power and ground pins 212, 214 through the metal layers and power and ground pins 232, 234 to couple the power supply and ground to the on die capacitor 280; and the paths that extend through the metal layers from the on package capacitors 260, 270 to the on die capacitor 280 to connect these capacitors.

In accordance with one embodiment, on package capacitors 260, 270 are tunable and have different capacitances and therefore different parasitic resistances and inductances. After the circuit is made, the capacitance and parasitic resistance and inductance values of the on package capacitors 260, 270 may be optimized using a signal jitter to power noise sensitivity map. The optimized capacitance, resistance and inductance values may then be used for the fabrication of production devices.

FIG. 3 depicts this process. At step 310, a power distribution network is fabricated. The network includes first and second tunable decoupling capacitors that are mounted on the package substrate. The capacitors are connected in parallel and the capacitance of one is at least fifty percent (50%) greater than the capacitance of the other. System level impedance versus operating frequency for this network will be found to vary considerably over its operating range. In addition, the network design is unable to take into consideration the effect of power noise on signal jitter because this effect is largely unknown at the time the circuit is designed.

At step 320, the sensitivity of signal jitter to power noise is determined over the operating frequencies of the power distribution network. At step 330, the capacitance values of the first and second decoupling capacitors are adjusted so as to reduce the magnitude of the system level impedance at least at those frequencies having substantial signal jitter to power noise sensitivity. As a result, new capacitance values are determined for the first and second capacitors. A power distribution network is then fabricated at step 340 that is essentially the same as that made in step 310 but uses decoupling capacitors that have the new capacitance values. Since this network is optimized with respect to signal jitter to power noise, the network can be mass produced and widely distributed.

Several paths shown in FIG. 4 are of particular interest in the optimization process. A first path 410 is from a power supply 480 through external circuitry such as a printed circuit board to a power pin 212 on substrate 220 and from there through the substrate to on package capacitor 260. A return path from capacitor 260 goes through the substrate and ground pin 214 to ground. A second path 420 is from power supply 480 through external circuitry to power pin 212 on substrate 220 and from there through the substrate to on package capacitor 270. A return path from capacitor 270 goes through the substrate and ground pin 214 to ground. A third path 430 is from on package capacitor 260 through the substrate and power pin 232 to on die capacitor 280. A fourth path 440 is from on package capacitor 270, through the substrate and power pin 232 to on die capacitor 280. As will be apparent, capacitors 260 and 270 are connected in parallel. A fifth path 450 is from power supply 480 through external circuitry to power pin 212 on substrate 220 and from there through the substrate and power pin 232 to on die capacitor 280. A return path from capacitor 280 goes through the substrate and ground pin 214 to ground.

Each of these paths has a resistance, an inductance, and a capacitance. In first path 410, there are a first inductance L0 in the substrate between the power pin and on package capacitor 260, a capacitance C1 of on package capacitor 260, and a parasitic equivalent series resistance R1 and equivalent series inductance L1 associated with capacitor 260. In second path 420, there are the first inductance L0, a capacitance C2 of on package capacitor 270, and a parasitic equivalent series resistance R2 and equivalent series inductance L2 associated with capacitor 270.

In the third path 430, there are the capacitance C1 and associated parasitic R1 and L1, the inductance L3 of the substrate between the capacitor 260 and power pin 232, the capacitance C3 of the on die capacitor 380 and the parasitic resistance R3 associated with the on die capacitor. In the fourth path 440, there are the capacitance C2 and associated parasitic R2 and L2, the inductance L4 of the substrate between capacitor 270 and power pin 232, the capacitance C3 of the on die capacitor 280 and the parasitic resistance R3 of the capacitor. Any parasitic inductance associated with the on die capacitor is minimal and can be ignored.

In the fifth path 450, there is a substrate inductance, the capacitance C3 of the on die capacitor 280 and the parasitic resistance R3 associated with the on die capacitor. The substrate inductance is modeled as a series combination of the first inductance L0 with a parallel combination of second and third substrate inductances L3 and L4.

In accordance with an embodiment of the present invention, capacitance C1 and C2 are different and one capacitance is at least 50 percent (%) greater than the other capacitance. In other embodiments, one capacitance may be at least twice that of the other capacitance; and in another embodiment one capacitance may be at least four times that of the other capacitance. Illustratively, one of capacitances C1 and C2 is approximately 1000 nF. Capacitance C3 is typically 1 to 2 nF and the equivalent series resistance R3 is approximately 50 mOhms.

While the invention has been described using only two decoupling capacitors 260, 270 connected in parallel, the invention may be practiced using three or more capacitors, if desired.

Figure 1:
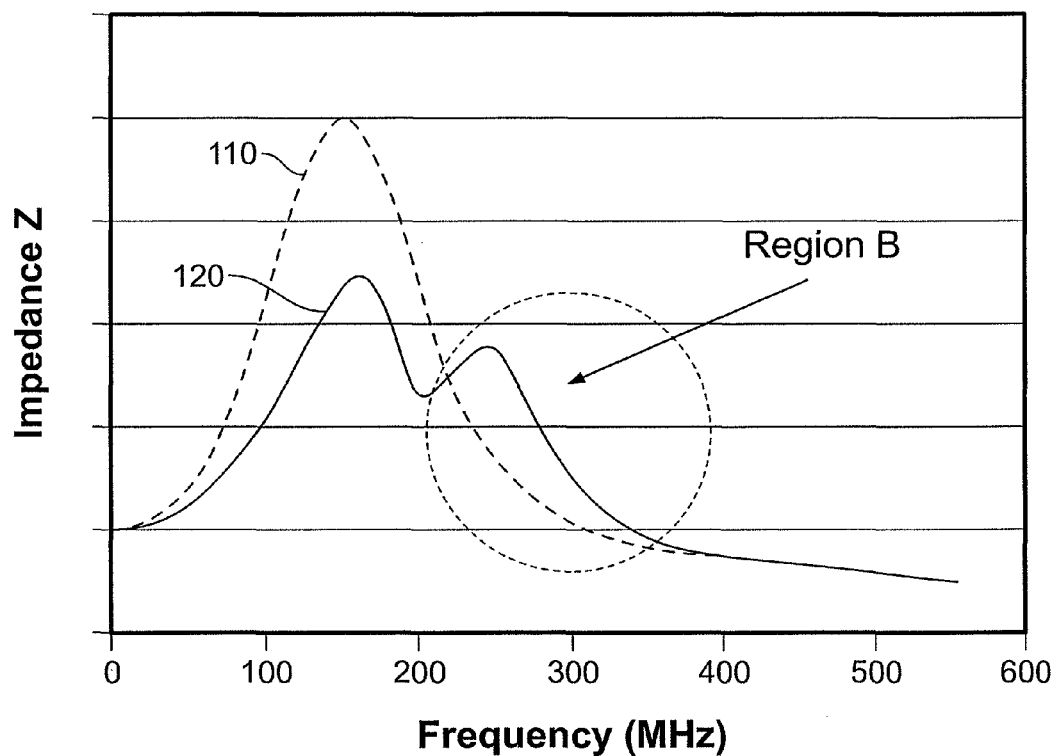
FIG. 1 is a plot of system level impedance versus frequency for certain prior art networks.
Figure 5:
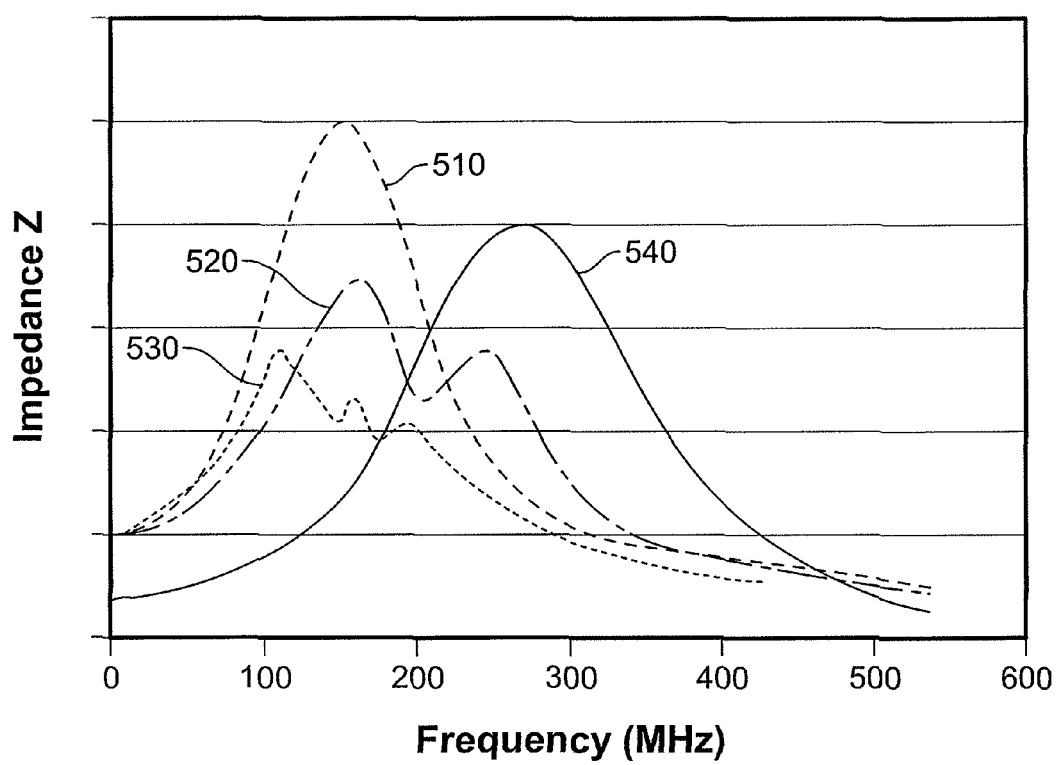
FIG. 5 is a plot of system level impedance versus frequency comparing the performance of an illustrative embodiment of the invention with prior art circuits.

FIG. 5 is a plot of the system level impedance of the power distribution network versus operating frequency for the two cases that are the subject of FIG. 1 and one example of the performance improvement that can be achieved with the invention. Plots 510 and 520 depict the system level impedance versus operating frequency for a prior art single path power distribution network and a three path power distribution network, respectively. Plot 530 depicts the system level impedance versus operating frequency for a power distribution network implemented in accordance with the invention. Plot 540 depicts the sensitivity of signal jitter to power noise versus frequency. As will be apparent, the impedance of the network formed in accordance with the invention is lower than that of either the single path or three path network except in the region near 100 MHz. However, the 100 MHz region is of little concern since it is a low sensitivity region.

As will be apparent to those skilled in the art, numerous variations may be practiced within the spirit and scope of the present invention.

What is claimed is:

1. A power distribution network comprising:
   first and second decoupling capacitors;
   an integrated circuit;
   a third capacitor formed in the integrated circuit; and
   a first electrical interconnection path coupling to a first lead of the first capacitor, a second electrical interconnection path coupling to a first lead of the second capacitor, a third electrical interconnection path coupling the first lead of the first capacitor to a first lead of the third capacitor, a fourth electrical interconnection path coupling the first lead of the second capacitor to the first lead of the third capacitor, and a fifth electrical interconnection path coupling to the first lead of the third capacitor.

2. The power distribution network of claim 1, wherein the first capacitor has a capacitance that is at least 50 percent (%) greater than a capacitance of the second capacitor.

3. The power distribution network of claim 1, wherein the first capacitor has a capacitance that is at least twice that of the second capacitor.

4. The power distribution network of claim 1, wherein the first capacitor has a capacitance that is at least four times as great as the capacitance of the second capacitor.

5. The power distribution network of claim 1, wherein a capacitance of the third capacitor ranges between approximately 1 and 2 nF.

6. The power distribution network of claim 1, wherein the first and second decoupling capacitors and the integrated circuit are mounted on a surface of a substrate and the first path includes a first substrate inductance, a capacitance of the first capacitor, and an equivalent series inductance and an equivalent series resistance associated with the first capacitor.

7. The power distribution network of claim 1, wherein the first and second decoupling capacitors and the integrated circuit are mounted on a surface of a substrate and the third path includes a capacitance of the first capacitor, an equivalent series inductance and an equivalent series resistance associated with the first capacitance, a second substrate inductance, a capacitance of the third capacitor, and an equivalent series resistance associated with the third capacitor.

8. The power distribution network of claim 1, wherein the first and second decoupling capacitors and the integrated circuit are mounted on a surface of a substrate and the fifth path includes a substrate inductance, a capacitance of the third capacitor and an equivalent series resistance associated with the third capacitor.

9. The power distribution network of claim 1, wherein the first and second capacitors are coupled in parallel.

10. The power distribution network of claim 1, wherein a capacitance of the first and second capacitors is tunable.

11. The power distribution network of claim 1, wherein a capacitance of the first and second capacitors is fixed.

12. A power distribution network comprising:
    first and second decoupling capacitors;
    an integrated circuit;
    a third capacitor formed in the integrated circuit;
    a first power supply lead coupling to a first lead of the first capacitor, a second power supply lead coupling to a first lead of the second capacitor, a third power supply lead coupling the first lead of the first capacitor to a first lead of the third capacitor, a fourth power supply lead coupling the first lead of the second capacitor to the first lead of the third capacitor, and a fifth power supply lead coupling to the first lead of the third capacitor; and
    ground leads coupling a second lead of the first capacitor, a second lead of the second capacitor, and a second lead of the third capacitor to ground.

13. The power distribution network of claim 12 wherein the first and second decoupling capacitors are tunable.

14. A method of forming a power distribution network comprising:
    fabricating a first power distribution network comprising:
        first and second tunable decoupling capacitors;
        an integrated circuit;
        a third capacitor formed in the integrated circuit;
    determining the signal jitter to power noise sensitivity for the first power distribution network;
    tuning capacitance values for the first and second capacitors to reduce signal jitter to power noise sensitivity, thereby determining new capacitance values for the first and second capacitors; and
    fabricating a second power distribution network similar to the first power distribution network but using first and second decoupling capacitors having the new capacitance values.

15. The method of claim 14 wherein the first capacitor has a capacitance that is at least fifty percent greater than the capacitance of the second capacitor.

16. The method of claim 14 wherein the first capacitor has a capacitance that is at least twice as great as the capacitance of the second capacitor.

17. The method of claim 14 wherein the first capacitor has a capacitance that is at least four times as great as the capacitance of the second capacitor.

18. The method of claim 14 wherein the first and second capacitors are connected in parallel.

19. The method of claim 14 wherein the first and second capacitors and the integrated circuit are mounted on a surface of a substrate.

20. The method of claim 19 wherein the first, second and third capacitors are coupled by a first electrical interconnection path coupling to a first lead of the first capacitor, a second electrical interconnection path coupling to a first lead of the second capacitor, a third electrical interconnection path coupling the first lead of the first capacitor to a first lead of the third capacitor, a fourth electrical interconnection path coupling the first lead of the second capacitor to the first lead of the third capacitor, and a fifth electrical interconnection path coupling to the first lead of the third capacitor.

* * * * *